United States Patent
Jo et al.

(10) Patent No.: US 10,622,583 B2
(45) Date of Patent: *Apr. 14, 2020

(54) DISPLAY APPARATUS WITH IMPROVED BONDING PERFORMANCE

(71) Applicant: SAMSUNG DISPLAY CO., LTD., Yongin-si, Gyeonggi-do (KR)

(72) Inventors: Minjun Jo, Yongin-si (KR); Jaekyung Go, Yongin-si (KR); Eunjae Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/364,069

(22) Filed: Mar. 25, 2019

(65) Prior Publication Data

US 2019/0221768 A1 Jul. 18, 2019

Related U.S. Application Data

(63) Continuation of application No. 15/220,113, filed on Jul. 26, 2016, now Pat. No. 10,276,824.

(30) Foreign Application Priority Data

Nov. 26, 2015 (KR) .......................... 10-2015-0166414

(51) Int. Cl.
*H01L 51/52* (2006.01)
*H01L 27/32* (2006.01)
(Continued)

(52) U.S. Cl.
CPC ........ *H01L 51/5246* (2013.01); *H01L 27/323* (2013.01); *H01L 27/3244* (2013.01);
(Continued)

(58) Field of Classification Search
CPC ............ H01L 51/5246; H01L 27/3276; H01L 51/524; H01L 51/525; H01L 27/32; H01L 51/56; H01L 51/5237
(Continued)

(56) References Cited

U.S. PATENT DOCUMENTS

2004/0004434 A1* 1/2004 Nishi .................... H01L 27/322
313/506
2005/0184927 A1* 8/2005 Kwak ................. H01L 27/3276
345/45

(Continued)

FOREIGN PATENT DOCUMENTS

KR 10-2012-0032250 A 4/2012
KR 10-2014-0013521 A 2/2014
(Continued)

*Primary Examiner* — Nduka E Ojeh
(74) *Attorney, Agent, or Firm* — Lewis Roca Rothgerber Christie LLP

(57) ABSTRACT

A display apparatus includes a first substrate corresponding to a display area and a surrounding area, a second substrate facing the first substrate, a seal member between the first substrate and the second substrate for bonding the first substrate and the second substrate to each other, a seal auxiliary portion between the first substrate and the seal member, and including a non-corner portion, and a corner portion, at least a portion of which extending beyond an extension line of the non-corner portion.

19 Claims, 8 Drawing Sheets

(51) Int. Cl.
  *H01L 51/00* (2006.01)
  *H01L 35/24* (2006.01)
  *H01L 29/08* (2006.01)
(52) U.S. Cl.
  CPC ...... *H01L 51/5243* (2013.01); *H01L 51/5253* (2013.01); *H01L 51/5293* (2013.01)
(58) Field of Classification Search
  USPC ......... 346/153; 257/40; 438/26, 46; 313/512
  See application file for complete search history.

(56) References Cited

U.S. PATENT DOCUMENTS

| | | | |
|---|---|---|---|
| 2010/0118250 A1* | 5/2010 | Fujikawa | G02F 1/1345 349/139 |
| 2011/0130002 A1 | 6/2011 | Bankaitis et al. | |
| 2011/0134022 A1* | 6/2011 | Nakagawa | G02F 1/133512 345/87 |
| 2011/0194063 A1 | 8/2011 | Lee et al. | |
| 2012/0074838 A1* | 3/2012 | Im | H01J 5/20 313/504 |
| 2013/0033834 A1* | 2/2013 | Kwon | H01L 51/5246 361/760 |
| 2013/0300283 A1 | 11/2013 | Im et al. | |
| 2013/0342889 A1* | 12/2013 | Kim | G02B 26/005 359/290 |
| 2014/0183458 A1* | 7/2014 | Lee | H01L 51/56 257/40 |
| 2014/0312322 A1 | 10/2014 | Jeong et al. | |
| 2015/0102293 A1* | 4/2015 | Cho | H01L 33/56 257/40 |
| 2016/0301028 A1* | 10/2016 | Ishii | H01L 51/5246 |

FOREIGN PATENT DOCUMENTS

| | | |
|---|---|---|
| KR | 10-2014-0062880 A | 5/2014 |
| KR | 10-2015-0014201 A | 2/2015 |
| KR | 10-2015-0042622 A | 4/2015 |

* cited by examiner

DISPLAY APPARATUS WITH IMPROVED BONDING PERFORMANCE

CROSS-REFERENCE TO RELATED APPLICATION

This application is a continuation of U.S. patent application Ser. No. 15/220,113, filed Jul. 26, 2016, which claims priority to and the benefit of Korean Patent Application No. 10-2015-0166414, filed Nov. 26, 2015, the entire content of both of which is incorporated herein by reference.

BACKGROUND

1. Field

One or more exemplary embodiments relate to a display apparatus.

2. Description of the Related Art

A display apparatus is configured to provide a user with visual information, such as an image, and may be of various types.

Particularly, because an organic light-emitting display apparatus is a self-emission type apparatus, and is configured to emit light by electrically exciting an organic compound, the organic light-emitting display apparatus is driven by relatively low voltage, is relatively slim, and has wide viewing angles and fast responses, the organic light-emitting display apparatus has garnered attention as a new generation display apparatus to solve problems and disadvantages associated with a liquid crystal display apparatus.

In the organic light-emitting display apparatus, a seal member is used to couple a lower substrate to an upper substrate. An area in which the seal member is located is a dead space where an image cannot be displayed. To reduce the dead space, a cut margin of the seal member is reduced.

SUMMARY

One or more embodiments include an organic light-emitting display apparatus to reduce a dead space, also to reduce delamination of a sealing member, and/or to improve a bonding force of a sealing member.

Additional aspects will be set forth in part in the description that follows and, in part, will be apparent from the description, or may be learned by practice of the presented embodiments.

According to one or more embodiments, a display apparatus includes a first substrate corresponding to a display area and a surrounding area, a second substrate facing the first substrate, a seal member between the first substrate and the second substrate for bonding the first substrate and the second substrate to each other, a seal auxiliary portion between the first substrate and the seal member, and including a non-corner portion, and a corner portion, at least a portion of which extending beyond an extension line of the non-corner portion.

A width of the corner portion may be greater than a width of the non-corner portion.

An outer line of the corner portion may extend toward an exterior of the seal auxiliary portion in a plan view while approaching a vertex of the corner portion.

An inner line of the corner portion may be an extension of an inner line of the non-corner portion.

The corner portion may be symmetrical with respect to a center axis of the corner portion.

The corner portion and the non-corner portion may include a metal.

The corner portion may be connected to the non-corner portion.

The corner portion and the non-corner portion may be at a same layer of the display apparatus.

The corner portion may include a first corner portion connected to the non-corner portion, and a second corner portion spaced from the first corner portion.

The second corner portion may be outside an extension line of the non-corner portion.

The first corner portion may be at a different layer than the second corner portion.

The first corner portion may be closer to the first substrate than the second corner portion.

The first corner portion may include a same material as a gate electrode of a first transistor in the display area, and the second corner portion may include a same material as a gate electrode of a second transistor in the display area.

The seal auxiliary portion may define a plurality of holes.

The display apparatus may further include an insulation layer between the seal member and the seal auxiliary portion.

The seal member may have an effective seal area to bond the first substrate and the second substrate to each other, and an area of the seal auxiliary portion overlapping the corner portion may be greater than an area of the seal auxiliary portion overlapping the non-corner portion.

A minimum width of the seal member may be greater than about 700 μm.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
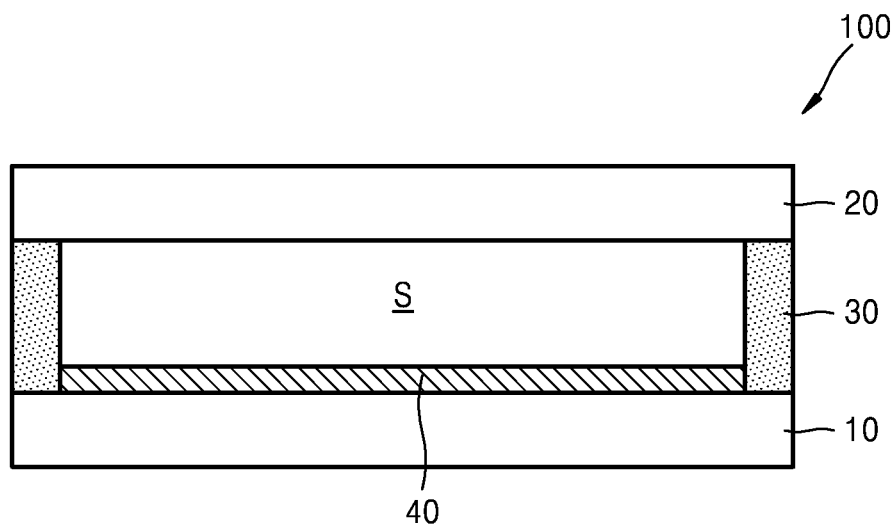
FIG. 1 is a view schematically illustrating a display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In an exemplary embodiment, a display apparatus is explained with reference to an organic light-emitting display device (OLED) as an example. However, the display apparatus may not be limited thereto, and may be a display apparatus which displays an image according to a predetermined power supply, for example, a liquid crystal display device (LCD), a field emission display device (FED), an electronic paper display device (EPD), and so on.

Figure 2:
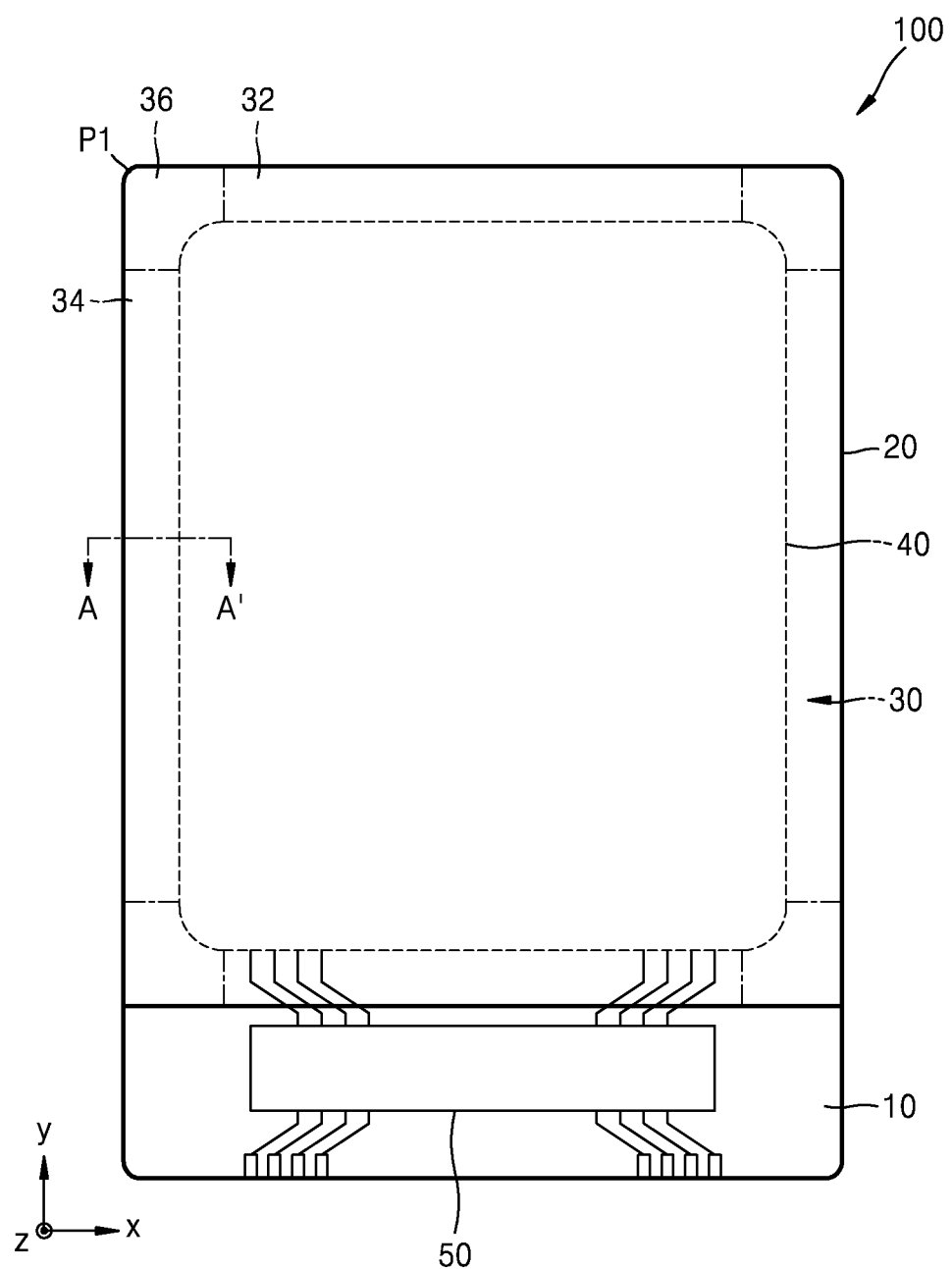
FIG. 2 is a plan view schematically illustrating the display apparatus of FIG. 1.

FIG. 1 is a view schematically illustrating a display apparatus 100 according to an embodiment, and FIG. 2 is a plan view schematically illustrating the display apparatus 100 of FIG. 1.

Referring to FIGS. 1 and 2, the display apparatus 100 includes a first substrate 10 including a display area 40, a second substrate 20 facing the first substrate 10, and a sealing member 30 surrounding the display area 40, and bonding the first substrate 10 and the second substrate 20 to each other.

The first substrate 10 may include a transparent glass material having silicon oxide ($SiO_2$) as a main component thereof, but is not limited thereto, and may include a transparent plastic material. The first substrate 10 may be a flexible substrate. Because the flexible substrate has a specific gravity that is smaller than a specific gravity of a glass substrate, the flexible substrate may be a material that is light in weight, and virtually unbreakable (e.g., a polymer material such as a flexible plastic film).

The display area 40 of the first substrate 10 may include driving thin film transistors over the first substrate 10, capacitor Cst, and an organic light-emitting device (OLED), which are arranged over the first substrate 10. Detailed descriptions of the display area 40 will be explained later.

The second substrate 20 may correspond to the first substrate 10, and may include at least one of various materials, such as a glass material, a metal material, and a plastic material. A functional film to perform various functions may be arranged over the second substrate 20. For example, the functional film may include at least one of a polarizer, a touch screen, and a cover window.

The touch screen may include a structure in which a touch screen pattern is directly arranged on the second substrate 20, such as an on-cell touch screen panel. The polarizer reduces or prevents external light reflected from the display area 40. The cover window may protect the display apparatus 100 from outside.

The first substrate 10 and the second substrate 20 may be attached to each other by the seal member 30. The seal member 30 may contact a portion of the display area 40, and may hermetically seal the display area 40 from the outside/an external environment. Therefore, the seal member 30 may protect the display area 40 from outside. An absorbent or filler may be arranged in a space S that is sealed by the first substrate 10, the second substrate 20, and the seal member 30.

Because a portion of the seal member 30 contacts the portion of the display area 40, a dead space by the seal member 30 may be reduced (e.g., dead space otherwise between the display area 40 and the seal member 30), and an area of the display area 40 is also maintained. However, the present inventive concept is not limited thereto, and there may be a space between the seal member 30 and the display area 40.

Although the seal member 30 corresponds to dead space, the seal member 30 may have a certain width to protect the display area 40 from outside. For example, a minimum width of the seal member 30 may be greater than about 700 μm.

A pad portion 50 may be mounted at a boundary portion of the first substrate 10, which is not covered by the second substrate 20. A metal wiring to connect the pad portion 50 to the display area 40 may be arranged between the first substrate 10 and the seal member 30.

The seal member 30 may include a material that is melted by certain thermal energy, and may include a material that is hardened by light. For example, the seal member 30 may include glass frit.

For example, after the first substrate 10 and the second substrate 20 are aligned to each other, light, such as UV light or a laser, may be irradiated on the seal member 30 through the second substrate 20. The seal member 30 may be melted according to the light irradiation, and thus the first substrate 10 and the second substrate 20 may be bonded to each other.

The seal member 30 may have a rectangular shape, and may include a first region 32 arranged in an "x" axis direction, and may include a second region 34 arranged in a "y" axis direction. The seal member 30 may further include a third region 36 at which the first region 32 and the second region 34 meet (e.g., between the first region 32 and the second region 34). The third region 36 may correspond to an area including a corner of the rectangular shape.

To improve strength of the attachment of the first substrate 10 and the second substrate 20, a width of the third region 36 may be greater than widths of the first region 32 and the second region 34. That is, cross-sections of the first region 32 and the second region 34 may be broken or delaminated during the cutting of the first substrate 10 and the second substrate 20 because the third region 36 is a curved shape portion. For example, widths of the first and second regions 32 and 34 may be respectively constant. The width of one side of the third region 36 meets the first region 32, and may be same as the width of the first region 32. The width of the third region 36 may gradually increase from the first region 32 toward to a vertex of the third region 36, and may then gradually decrease away from the vertex, such that the width of the other side of the third region 36 meets the second region 34, and may be same as the width of the second region 34.

Although the width of the third region 36 may be greater than the widths of the first region 32 and the second region 34, an area of the seal member 30 exposed by the laser may bond the first substrate 10 to the second substrate 20 together. An area of the seal member 30 exposed by the laser may be referred to as an effective seal region. Generally, because the laser moves along a trajectory of the rectangular shape, a width of the laser, which passes through the first region 32 and the second region 34, may be same as a width of the laser that passes through the third region 36 of the seal member 30. Therefore, bonding performance of the third region 36 may be lower than bonding performance of the first region 32 and the second region 34.

According to an embodiment, the display apparatus 20 may include a seal auxiliary portion 60 (see FIG. 3), which is arranged between the first substrate 10 and the seal member 30, and which may have a variable width.

Figure 3:
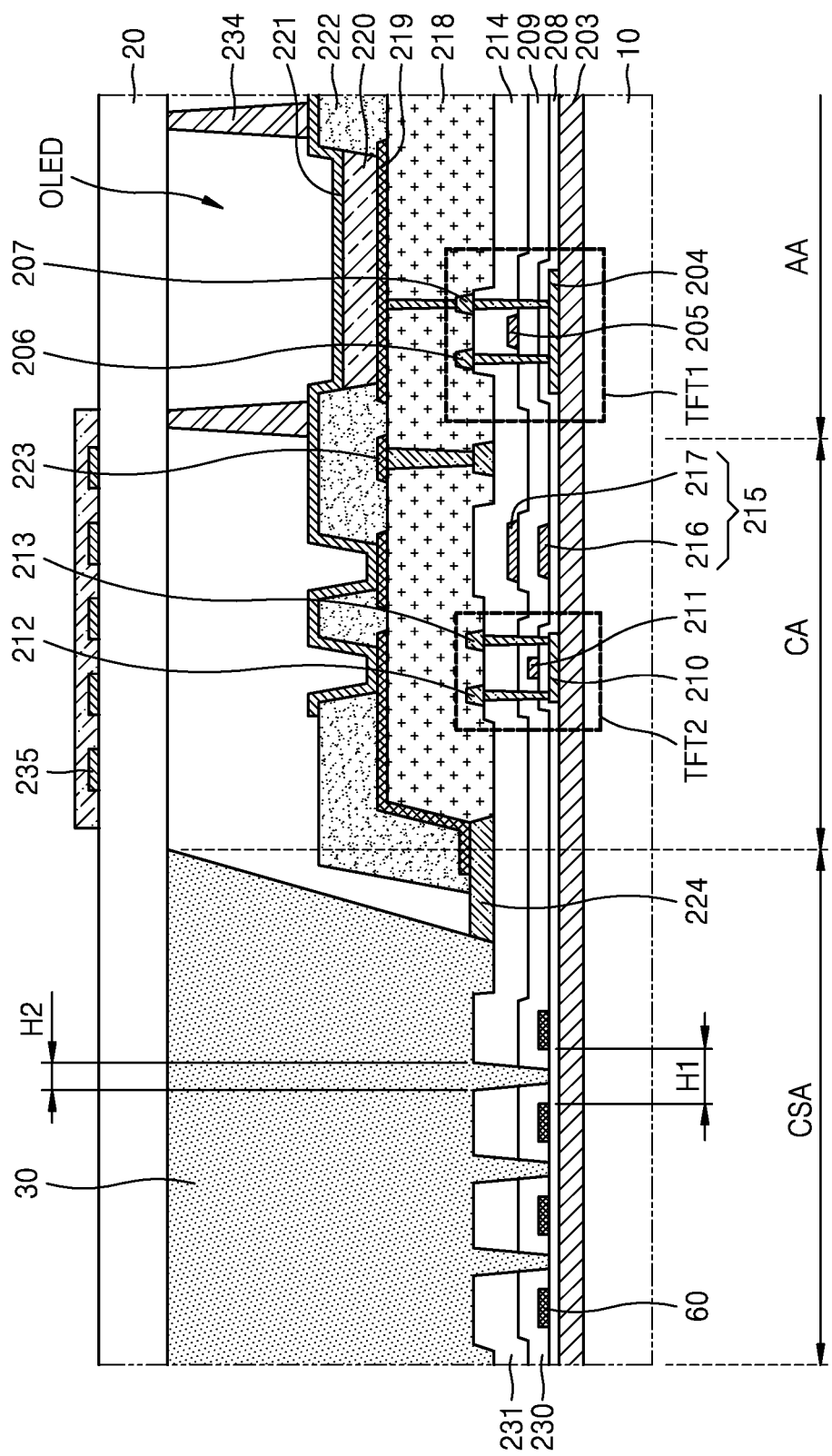
FIG. 3 is a cross-sectional view of a partially enlarged portion of the display apparatus of FIG. 1.
Figure 4:
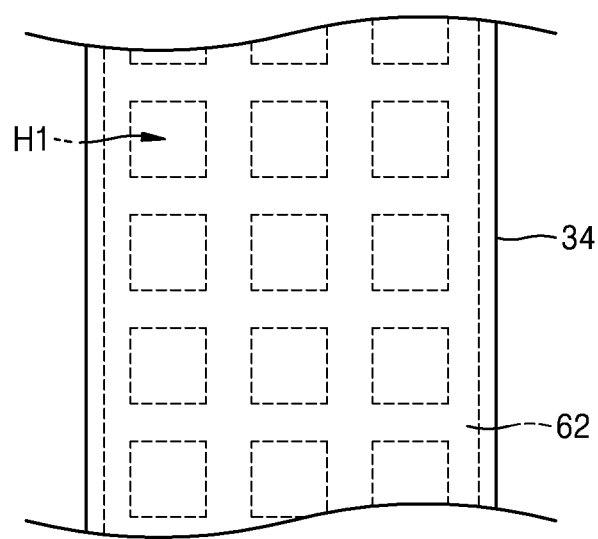
FIG. 4 is a plan view illustrating a relationship between a first area and a non-corner portion of a seal auxiliary portion of a sealing member of the display apparatus of FIG. 1.
Figure 5:
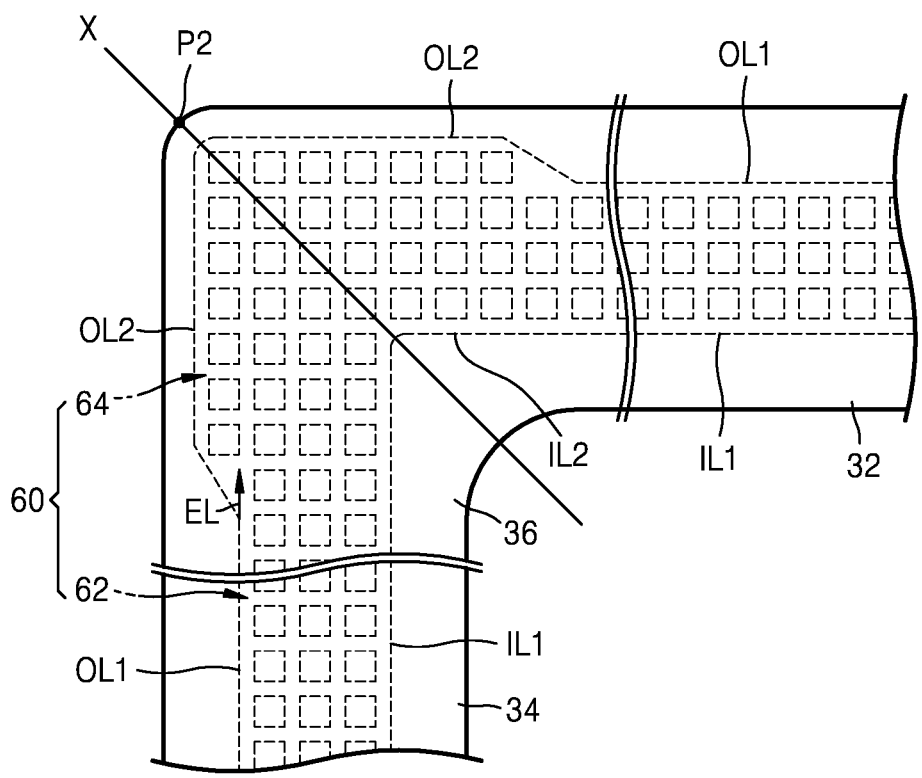
FIG. 5 is a plan view illustrating a relationship between a third area and a corner portion of a seal auxiliary portion of a sealing member of the display apparatus of FIG. 1.

FIG. 3 is a cross-sectional view of a partially enlarged portion of the display apparatus 100 of FIG. 1, FIG. 4 is a plan view illustrating a relationship between the first region 32 and a non-corner portion 62 of the seal auxiliary portion 60 of the sealing member 30 of the display apparatus of FIG. 1, and FIG. 5 is a plan view illustrating a relationship between the third region 36 and a corner portion 64 of the seal auxiliary portion 60 of the sealing member 30 of the display apparatus 100 of FIG. 1.

The first substrate 10 includes an active area AA, a circuit area CA extended outside the active area AA, and a cell seal area CSA extended outside the circuit area CA. The active area AA and the circuit area CA are referred to as a display area (e.g., the display area 40), and areas other than the active area AA and the circuit area CA are referred to as a surrounding area.

The active area AA includes an area to display an image, the circuit area CA includes an area in which a circuit pattern is arranged to electrically communicate with components of the active area AA, and the cell seal area CSA includes an area to bond the first substrate 10 and the second substrate 20 together.

A buffer film 203 may be on the first substrate 10, and flattens a surface of the first substrate 10, and also prevents permeation of external moisture and air. The buffer film 203 may include at least one of an inorganic film, such as silicon oxide, may include an organic film, such as polyimide, or may include a multilayer structure of the inorganic film and the organic film.

At least one thin film transistor TFT may be arranged in each of the active area AA and the circuit area CA. Each of the active area AA and the circuit area CA may include a plurality of thin film transistors TFT. In the present embodiment, various different thin film transistors TFTs may be arranged in each of the active area AA and the circuit area CA. However, the foregoing is only an example, and the present inventive concept is not limited thereto.

A first thin film transistor TFT1 is arranged in the active area AA, and includes a first semiconductor active layer 204, a first gate electrode 205, a first source electrode 206, and a first drain electrode 207. A first gate insulation film 208 and a second gate insulation film 209 are arranged between the first gate electrode 205 and the first semiconductor active layer 204, and insulate the first gate electrode 205 from the first semiconductor active layer 204.

A second thin film transistor TFT2 is arranged in the circuit area CA, and includes a second semiconductor active layer 210, a second gate electrode 211, a second source electrode 212, and a second drain electrode 213. The first gate insulation film 208 is arranged between the second semiconductor active layer 210 and the second gate electrode 211, and insulates the second semiconductor active layer 210 from the second gate electrode 211.

When the first thin film transistor TFT1 and the second thin film transistor TFT2 are compared to each other, in the first thin film transistor TFT1, the gate insulation film 209 is further arranged between the first semiconductor active layer 204 and the first gate electrode 205. That is, the first thin film transistor TFT1 includes an insulation layer that is thicker than an insulation layer of the second thin film transistor TFT2. When a transistor includes a relatively thick insulation layer, a driving range of a gate voltage, which is applied to a gate electrode, may be widened in the transistor.

The first thin film transistor TFT1 may be a driving thin film transistor to drive an organic light-emitting device OLED. When a driving voltage of the driving thin film transistor is widened, light emitted from the organic light-emitting device OLED may be controlled to provide sufficient gradations to an image.

The first gate electrode 205 and the second gate electrode 211 may be at different layers. Accordingly, when the first thin film transistor TFT1 and the second thin film transistor TFT2 are adjacent to each other, interference does not occur between the first thin film transistor TFT1 and the second thin film transistor TFT2, and thus, more components may be disposed in a same area.

The first semiconductor active layer 204 and the second semiconductor active layer 210 may be on the buffer layer 203. The first semiconductor active layer 204 and the second semiconductor active layer 210 may include an inorganic semiconductor, such as amorphous silicon or polysilicon, or may include an organic semiconductor.

In an embodiment, the first semiconductor active layer 204 and the second semiconductor active layer 210 may include an oxide semiconductor. For example, the oxide semiconductor may include an oxide material that is selected from Groups 4, 12, 13, and 14 such as zinc (Zn), indium (In), gallium (Ga), tin (Sn), cadmium (Cd), germanium (Ge), Hafnium (Hf), and/or a mixture thereof.

The first gate insulation film 208 may be on the buffer film 203, and may cover the first semiconductor active layer 204 and the second semiconductor active layer 210.

The second gate electrode 211 is on the first gate insulation film 208, and may overlap a portion of the second semiconductor active layer 210.

The second gate insulation film 209 covers the second gate electrode 211.

The first gate electrode 205 is on the second gate insulation film 209, and may overlap a portion of the first semiconductor active layer 204.

The first gate electrode 205 and the second gate electrode 211 may include a single film of gold (Au), silver (Ag), copper (Cu), nickel (Ni), platinum (Pt), palladium (Pd), aluminum (Al), Molybdenum (Mo), or chrome (Cr), may include a multilayer, or may include an alloy of aluminum-neodymium (Al:Nd) and/or molybdenum-tungsten (Mo:W).

The first gate insulation film 208 and the second gate insulation film 209 may include an inorganic film, such as silicon oxide, silicon nitride, and/or metal oxide. The first gate insulation film 208 and the second gate insulation film 209 may include a single layer or a multilayer.

An interlayer insulation film 214 may be on the second gate insulation film 209, and may cover the first gate electrode 205. The interlayer insulation film 214 may include an inorganic film, such as silicon oxide and/or silicon nitride. In an embodiment, the interlayer insulation film 214 may include an organic film, such as polyimide.

The first source electrode 206 and the first drain electrode 207 are on the interlayer insulation film 214, and contact the first semiconductor active layer 204 through respective contact holes. Moreover, the second source electrode 212 and the second drain electrode 213 are also on the interlayer insulation film 214, and contact the second semiconductor active layer 210 through respective contact holes.

The first source electrode 206, the second source electrode 212, the first drain electrode 207, and the second drain electrode 213 may include a metal, an alloy, metal nitride, conductive metal oxide, and/or a transparent conductive material.

A structure of the thin film transistor is not limited to the above description. The thin film transistor may have various structures. For example, although the above-described thin film transistor includes a top gate structure, the first gate electrode 205 may be below the first semiconductor active layer 204 as a bottom gate structure.

A capacitor 215 may be arranged in the circuit area CA. The active area AA may include a plurality of capacitors. The capacitor 215 includes a first capacitor electrode 216, a second capacitor electrode 217, and the second gate insulation film 209 therebetween. The first capacitor electrode 216 may include a same material as the second gate electrode 211. The second capacitor electrode 217 may include a same material as the first gate electrode 205.

A planarization film 218 covers the first and second thin film transistors TFT1 and TFT2, and the capacitor 215. The planarization film 218 is on the interlayer insulation film 214. The planarization film 218 removes a step, and performs planarization to increase a light-emitting efficiency of the organic light-emitting device OLED, which is arranged on the planarization film 218. In an embodiment, the planarization film 218 may have/define a hole to expose a portion of the first drain electrode 207. The planarization film 218 may include an insulation material. For example, the planarization film 218 may include a structure having a single layer, or having a multilayer of an inorganic compound, an organic compound, and/or an inorganic-organic compound, and may be formed according to various deposition methods. The planarization film 218 may include an organic compound, such as polyacrylate resin, epoxy resin, and/or benzocyclobutene (BCB), and/or may include an inorganic compound, such as silicon nitride (SiNx).

One of the planarization film 218 and the interlayer insulation film 214 may be omitted in other embodiments.

The organic light-emitting device OLED may be arranged on the planarization film 218. The organic light-emitting device OLED includes a first electrode 219, an intermediate layer 220 including an organic light-emitting layer, and a second electrode 221.

A pixel definition film 222 covers portions of the planarization film 218 and the first electrode 219, and defines a pixel area (e.g., active area AA) and a non-pixel area (e.g., circuit area CA and/or cell seal area CSA). The pixel definition film 222 may include an organic compound and/or an inorganic compound. For example, the pixel definition film 222 may include an organic compound, such as polyimide, polyamide, benzocyclobutene (BCB), acrylate resin, epoxy resin, and/or phenolic resin, and/or an inorganic compound, such as silicon nitride (SiNx). The pixel definition film 222 may include a signal layer or a multilayer.

Holes and electrons respectively of the first electrode 219 and the second electrode 221 of the organic light-emitting device OLED may emit light by combining with each other in the organic light-emitting layer of the intermediate layer 220.

The intermediate layer 220 may include the organic light-emitting layer. In another embodiment, the intermediate layer 220 may include an emissive layer, and may further include at least one of a hole injection layer (HIL), a hole transport layer (HTL), an electron transport layer (ETL), and an electron injection layer (EIL). However, the present inventive concept is not limited thereto. The intermediate layer 220 may include an emissive layer, and may further include at least one of various functional layers.

The second electrode 221 may be on the intermediate layer 220. The second electrode 221 may form an electrical field with the first electrode 219 so that light is emitted from the intermediate layer 220. The first electrode 219 may be patterned in each pixel, and the second electrode 221 may be formed to supply a common voltage to all pixels.

The first electrode 219 and the second electrode 221 may include a transparent electrode or a reflective electrode.

The first electrode 219 may function as an anode, and may include at least one of various conductive materials. The first electrode 219 may be a transparent electrode or a reflective electrode. For example, when the first electrode 219 is used as a transparent electrode, the first electrode 219 may include a transparent conductive film, such as indium tin oxide (ITO), indium zinc oxide (IZO), zinc oxide (ZnO), and/or indium oxide ($In_2O_3$). When the first electrode 219 is used as a reflective electrode, the first electrode may include a reflective film including gold (Au), silver (Ag), copper (Cu), nickel (Ni), platinum (Pt), palladium (Pd), aluminum (Al), Molybdenum (Mo), chrome (Cr), and/or a compound thereof, and may further include a transparent conductive film, which includes indium tin oxide (ITO), indium zinc oxide (IZO), zinc oxide (ZnO), and/or indium oxide ($In_2O_3$), and which is arranged on the reflective film.

The second electrode 221 may function as a cathode, and may be a transparent electrode or a reflective electrode. For example, when the second electrode 221 is used as a transparent electrode, the second electrode 221 may include a metal having a low work function, such as lithium (Li), calcium (Ca), lithium fluoride/calcium (LiF/Ca), lithium fluoride/aluminum (LiF/Al), aluminum (Al), and magnesium (Mg), and/or a compound thereof, which is formed on the intermediate layer 220, and may further include a transparent conductive film, such as indium tin oxide (ITO), indium zinc oxide (IZO), zinc oxide (ZnO), and/or indium oxide ($In_2O_3$), which is arranged on the metal/compound. When the second electrode 221 is used as a reflective electrode, the second electrode 221 may include lithium (Li), calcium (Ca), lithium fluoride/calcium (LiF/Ca), lithium fluoride/aluminum (LiF/Al), aluminum (Al), magnesium (Mg), and/or a compound thereof.

In the present embodiment, the first electrode 219 functions as an anode, and the second electrode 221 functions as a cathode. However, the present inventive concept is not limited thereto, and the first electrode 219 may function as a cathode, and the second electrode 221 may function as an anode.

Each organic light-emitting device OLED may correspond to a single pixel, and each pixel may generate red light, green light, blue light, or white light. However, the present disclosure is not limited thereto. The intermediate layer 220 may be commonly arranged on the entire first electrode 219 regardless of a location of the pixel. Layers including light-emitting materials to respectively emit red light, green light, and blue light may be vertically stacked in the organic light-emitting device OLED, or light-emitting materials to respectively emit red light, green light, and blue light may be combined in the organic light-emitting device OLED. When the organic light-emitting device OLED emits white light, it is possible to combine different colors. A color conversion layer or a color filter, which may convert emitted white light into a certain color, may be further included in the organic light-emitting device OLED.

A protection layer may be arranged on the second electrode 221. The protection layer may cover the organic light-emitting device OLED, and may include an inorganic insulation film and/or an organic insulation film.

A spacer(s) 234 may be arranged in the non-pixel area, and may be arranged between the first substrate 10 and the second substrate 20. The spacer 234 may reduce or prevent degradation of a display characteristic of the display apparatus 100 otherwise caused by an external shock/impact.

The second substrate 20 is combined over, or integrated above, the first substrate 10. The second substrate 20 may reduce or prevent permeation of moisture or oxygen into the organic light-emitting device OLED and other films.

The second substrate 20 may include a film having rigidity, such as a glass substrate, or may include a film having flexibility, such as polymer substrate. The second substrate 20 may be a multilayer in which an organic film and an inorganic film are alternately stacked.

A plurality of touch electrodes 235 may be arranged on the second substrate 20, and may collectively function as a touch screen. In addition, a functional film, such as a polarizing film, a color filter, or a cover window, may be arranged on the second substrate 20.

Various circuit patterns may be arranged in the circuit area CA. For example, the various circuit patterns may include a power supply pattern, an electrostatic prevention pattern, and other various circuit patterns.

A circuit wiring 223 may be arranged in the circuit area CA. The circuit wiring 223 may be arranged in the planarization film 218. The circuit wiring 223 may include a same material as the first electrode 219 of the organic light-emitting device OLED. The circuit wiring 223 may be electrically connected to a component of the active area AA (e.g., electrically connected to the second electrode 221 of the organic light-emitting device OLED).

The circuit wiring 223 may be connected to a power wiring 224. The power wiring 224 may be arranged on the interlayer insulation film 214. The power wiring 224 may include a same material as the first source electrode 206, the second source electrode 212, the first drain electrode 207, and the second drain electrode 213. The power wiring 224 may receive externally supplied power/power from outside. In an embodiment, the power wiring 224 may be a three layer structure of titanium (Ti), aluminum (Al), and titanium (Ti). The power wiring 224 may be a conductive layer because the power wiring 224 includes a conductive material.

The circuit wiring 223 and the power wiring 224 may be on different layers.

For example, the circuit wiring 223 may be on the planarization film 218. The circuit wiring 223 may be formed of the same material, and according to the same process, as the first electrode 219 of the organic light-emitting device OLED. The power wiring 224 may be on the interlayer insulation film 214. The power wiring 224 may be formed of the same material, and according to the same process, as the first source electrode 206, the second source electrode 212, the first drain electrode 207, and the second drain electrode 213. An end of the circuit wiring 223 may contact the power wiring 224. In an embodiment, at least a portion of the circuit wiring 223 may overlap the power wiring 224.

The seal member 30 is arranged in the cell seal area CSA, and may be between the first substrate 10 and the second substrate 20. A portion of the seal member 30 may contact the circuit area CA, and may be arranged along a boundary of the circuit area CA. for example, an area of the seal member 30 may contact the power wiring 224.

The seal member 30 may include glass frit. The glass frit may include a glass powder and an oxide powder. An organic compound is added to the glass frit including the oxide powder to produce a paste of a gel state. The paste of the gel state is sintered at a temperature in a range between about 300° C. and about 500° C. When the glass frit is sintered, the organic compound is evaporated, and the paste of the get state is hardened so that a frit of a solid state is produced.

A seal auxiliary portion 60, and first and second insulation layers 230 and 231 to cover the seal auxiliary portion 60, may be arranged beneath the seal member 30. The seal auxiliary portion 60 is in the cell seal area CSA, and includes/defines a plurality of first holes H1. The first and second insulation layers 230 and 231 cover the seal auxiliary portion 60, and include/define a plurality of second holes H2. The seal auxiliary portion 60 may absorb heat of a laser or reflect the laser, so that the seal auxiliary portion 60 transmits the heat of the laser to the seal member 30. The seal auxiliary portion 60 may be arranged on the first gate insulation film 208. The seal auxiliary portion 60 may include the same material as the second gate electrode 211 of the second thin film transistor TFT2, which is arranged in a display area 40 of the display apparatus 100. For example, the seal auxiliary portion 60 may include a single layer including gold (Au), silver (Ag), copper (Cu), nickel (Ni), platinum (Pt), palladium (Pd), aluminum (Al), Molybdenum (Mo), and/or chrome (Cr), or may include a multilayer thereof. The seal auxiliary portion 60 may include an alloy of aluminum-neodymium (Al:Nd) and/or molybdenum-tungsten (Mo:W).

The seal auxiliary portion 60 may include the plurality of first holes H1. The plurality of first holes H1 may be arranged two-dimensionally (e.g., in a matrix in a plane). Some or all of the first holes H1 may have a same size, or two or more of the first holes H1 may have different sizes. For example, a size of each of the first holes H1 may be greater than about 3 μm. A distance between the adjacent first holes H1 may be greater than about 2.5 μm.

The first and second insulation layers 230 and 231 are arranged under the seal member 30, and cover the seal auxiliary portion 60. The first and second insulation layers 230 and 231 may have/define the plurality of second holes H2.

The second holes H2 may be arranged two-dimensionally (e.g., in a plane). Some or all of the second holes H2 may have a same size, or two or more of the second holes H2 may have different sizes. Although two of the plurality of first holes H1 may be differently sized, a size of the second holes H2 may be smaller than a size of the first holes H1. The second holes H2 may respectively overlap a corresponding first holes H1. The seal member 30 may be filled in the second holes H2.

The first insulation layer 230 and the second insulation layer 231 may include a same material, or may include different materials from each other. For example, the first insulation layer 230 may include the same material as the second gate insulation film 209, and may be at the same layer as the second gate insulation film 209. The second insulation layer 231 may include the same material as the interlayer insulation film 214, and may be at the same layer as the interlayer insulation film 214.

A cross-section of the above-described first and second holes H1 and H2 may be a rectangular shape. However, the present inventive concept is not limited thereto. For example, the cross-section of the first and second holes H1 and H2 may be a polygonal shape, a circular shape, an elliptical shape, or some other shape that is different from the rectangular shape. The cross-sections of the first holes H1 and the corresponding second holes H2 may be the same or may be different.

Because the seal member 30 covers the first and second insulation layers 230 and 231, the seal auxiliary portion 60 may reduce or prevent hillock phenomena and bubbles occurring due to a rapid temperature increase by a laser. Each of the first and second insulation layers 230 and 231 has/defines the second holes H2. The second holes H2 are filled with the seal member 30, and thus a bonding strength between the seal member 30 and the first and second insulation layers 230 and 231 may be improved.

The seal auxiliary portion 60, which is arranged below the seal member 30, is a structure that improves a mechanical strength by enlarging an effective bonding area. To increase or maximize the effective bonding area, it may be suitable to increase or maximize an overlap area between the seal member 30 and the seal auxiliary portion 60. For example, a width of the third region 36 of the seal member 30 may be larger than widths of the first and second regions 32 and 34 (e.g., in a plan view, or in a plane defined by the "x" axis direction and the "y" axis direction). However, because a width of the laser to which the first and second regions 32 and 34 are exposed is the same as the width of the laser to which the third region 36 is exposed, the third region 36 may be bonded relatively weaker (e.g., may have a relatively weaker bond strength) than the first and second regions 32 and 34. Accordingly, breaking and delamination of the third region 36 may occur during a process of cutting the display apparatus 100.

In an embodiment, the seal auxiliary portion 60 may increase an overlap area with the third region 36 to a greater extent than an overlap area with the first and second regions 32 and 34 (e.g., the seal auxiliary portion 60 may overlap a greater percentage of the third region 36 than the first and second regions 32 and 34, or the effective seal area in the corner portion 64 may be greater than the effective seal area in the non-corner portion 62). As illustrated in FIGS. 4 and 5, the seal auxiliary portion 60 may be divided into a non-corner portion 62 and a corner portion 64 according to an overlap between the seal auxiliary portion 60 and the first through the third regions 32, 34, and 36. As illustrated in FIGS. 4 AND 5, the non-corner portion 62 overlaps the second region 34 of the seal member 30, and as illustrated in FIG. 5, the corner portion 64 overlaps the curved shape portion (e.g., the third region 36) of the seal member 30. Although an overlap area between the seal auxiliary portion 60 and the third region 36 is illustrated as the corner portion 64 in FIG. 5, the present disclosure is not limited thereto. An overlap area between the seal auxiliary portion 60 and the second region 34 may also be illustrated as the corner portion 64.

The non-corner portion 62 and the corner portion 64 may be connected to each other in a similar way to connection among the first through third regions 32, 34, and 36 of the seal member 30 in a single, unitary body. The non-corner portion 62 and the corner portion 64 may be at a same layer. For example, as illustrated in FIG. 3, the non-corner portion 62 and the corner portion 64 are on the first gate insulation film 208. However, the present disclosure is not limited thereto. The seal auxiliary portion 60 may also be arranged on the first insulation layer 230, and the non-corner portion 62 and the corner portion 64 may be arranged on different layers.

A width of the non-corner portion 62 may be constant, but a width of the corner portion 64 may be not constant, or may be non-uniform. Also, the width of the corner portion 64 may be greater than the width of the non-corner portion 62. For example, at least a portion of the corner portion 64 may protrude from, or extend beyond in the "x" axis direction and/or the "y" axis direction, an extension line of the non-corner portion 62 (e.g., extension line EL described below).

In detail, an outer line OL2 of the corner portion 64 may include an externally protruding area (e.g., an area protruding toward the exterior of the seal auxiliary portion 60) approaching a vertex P2, and may also include an area parallel to an outer line of the seal member 30 and/or an extension line EL of an outer line OL1 of the non-corner portion 62. Moreover, an inner line IL2 of the corner portion 64 may include an area corresponding to an extension line of an inner line IL1 of the non-corner portion 62 (e.g., the inner line IL2 may essentially be an extension of the inner line IL1). Furthermore, the corner portion 64 may have symmetry with respect to a center axis "X" of the corner portion 64.

As described above, because the width of the corner portion 64 is greater than the width of the non-corner portion 62, the seal member 30 at the corner portion 64 may be exposed due to an increased temperature of the corner portion 64 by the laser, even though the width of the laser to expose the corner portion 64 is same as the width of the laser to expose the non-corner portion 62. As such, due to the increased width, an effective bonding area of the seal member 30 that overlaps the corner portion 64 becomes greater than an effective bonding area of the seal member 30 which overlaps the non-corner portion 62.

Figure 6:
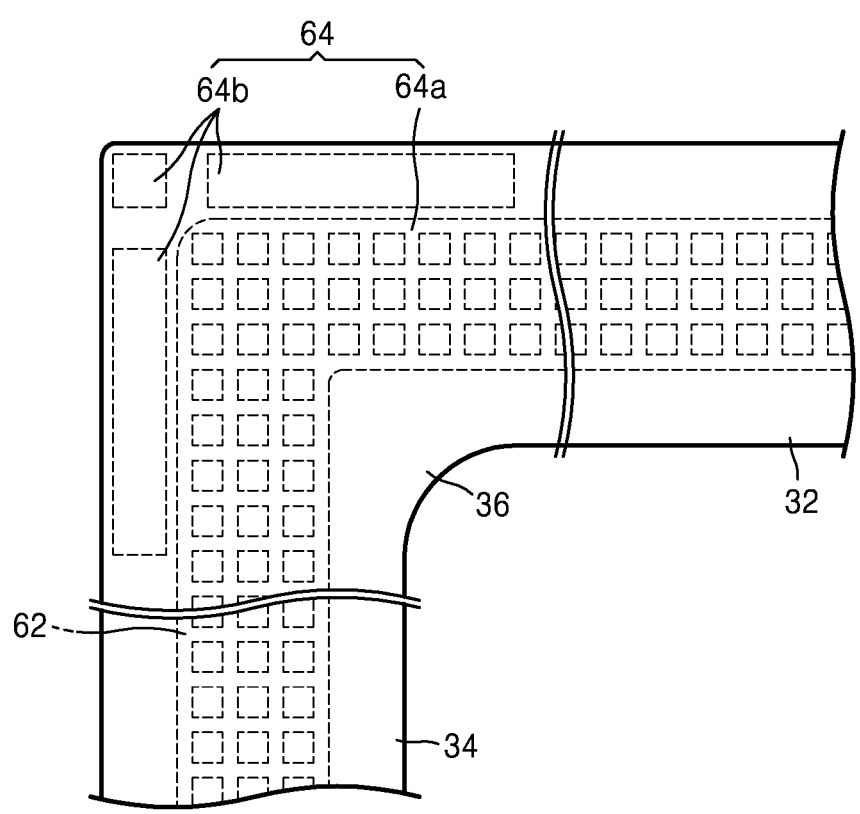
FIG. 6 is a plan view illustrating a relationship between a corner portion and a sealing member of the display apparatus of FIG. 1.

FIG. 6 is a plan view illustrating a relationship between the corner portion 64 and the sealing member 30 according to another embodiment. As illustrated in FIG. 6, the corner portion 64 includes a first corner portion 64a, which is connected to the non-corner portion 62, and one or more second corner portions 64b, which is/are spaced from the first corner portion 64a. The second corner portions 64b may be arranged outside an extension line of the non-corner portion 62 (e.g., extension line EL of FIG. 5). Therefore, a cross-section of the corner portion 64 may be greater than a cross-section of the non-corner portion 62. Because the second corner portions 64b are spaced apart from the first corner portion 64a, introduction of an externally applied electrostatic force into an inside of the display apparatus 100 may be reduced or prevented. The first corner portion 64a and the second corner portion(s) 64b may be at a same layer, or may be at different layers.

Figure 7:
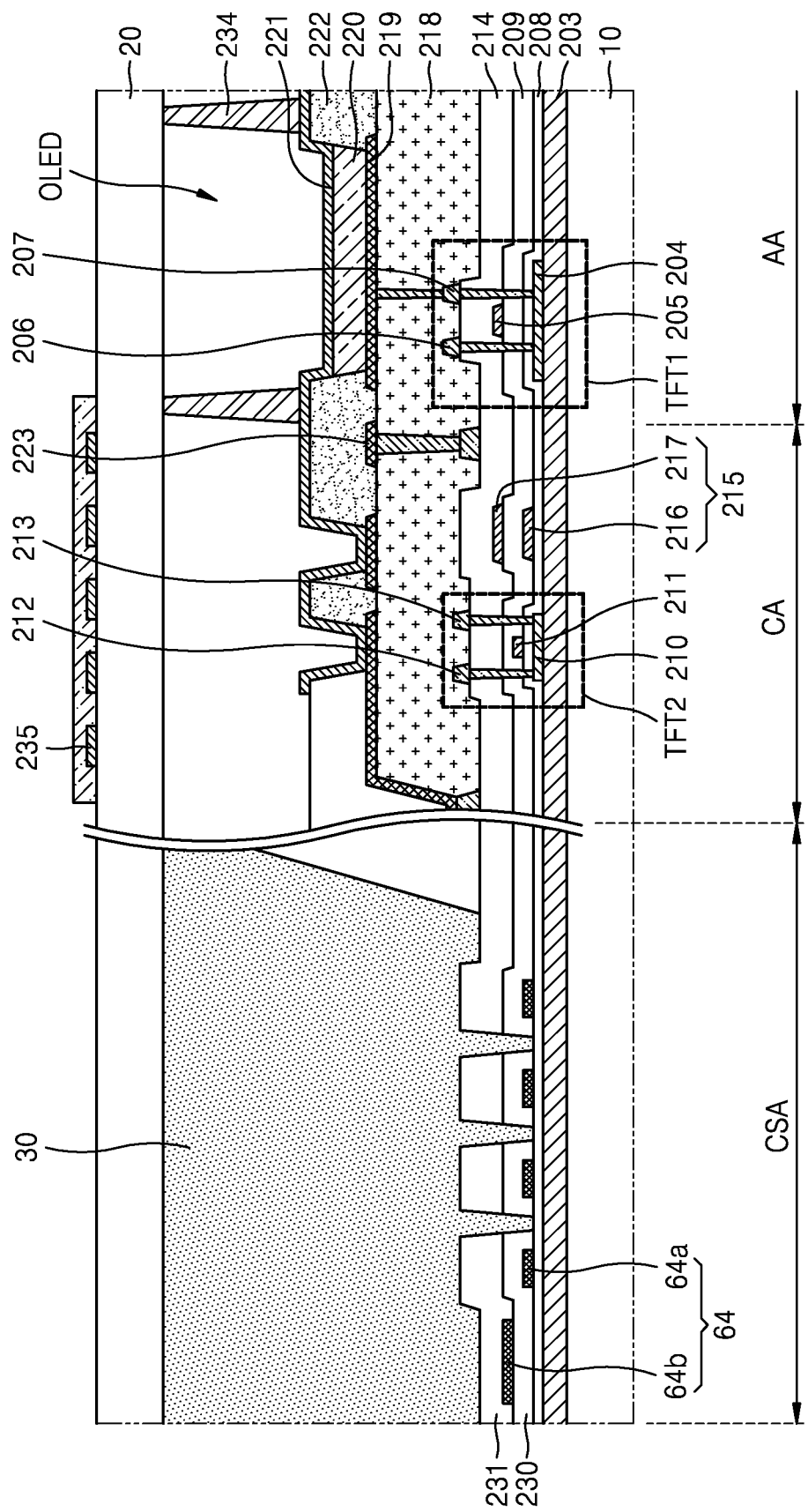
FIG. 7 is a cross-sectional view illustrating a relationship between a first corner portion and a second corner portion, which are disposed on different layers in the display apparatus of FIG. 6.

FIG. 7 is a cross-sectional view illustrating a relationship between the first corner portion 64a and the second corner portion 64b, which are arranged on different layers of a display apparatus. Referring to FIG. 7, the first corner portion 64a may be arranged on different steps from, or at a different layer than, the second corner portion(s) 64b. For example, the first corner portion 64a may be arranged to be closer to the first substrate 10 than the second corner portion 64b. The first corner portion 64a may include the same material as the second gate electrode 211 of the second thin film transistor TFT2, which is arranged in the display area 40, and may be arranged at the same layer as the second gate electrode 211 of the second thin film transistor TFT2. The second corner portion 64b may include the same material as, and may be at the same layer as, the first gate electrode 205 of the first thin film transistor TFT1, which is arranged in the display area 40.

Figure 8:
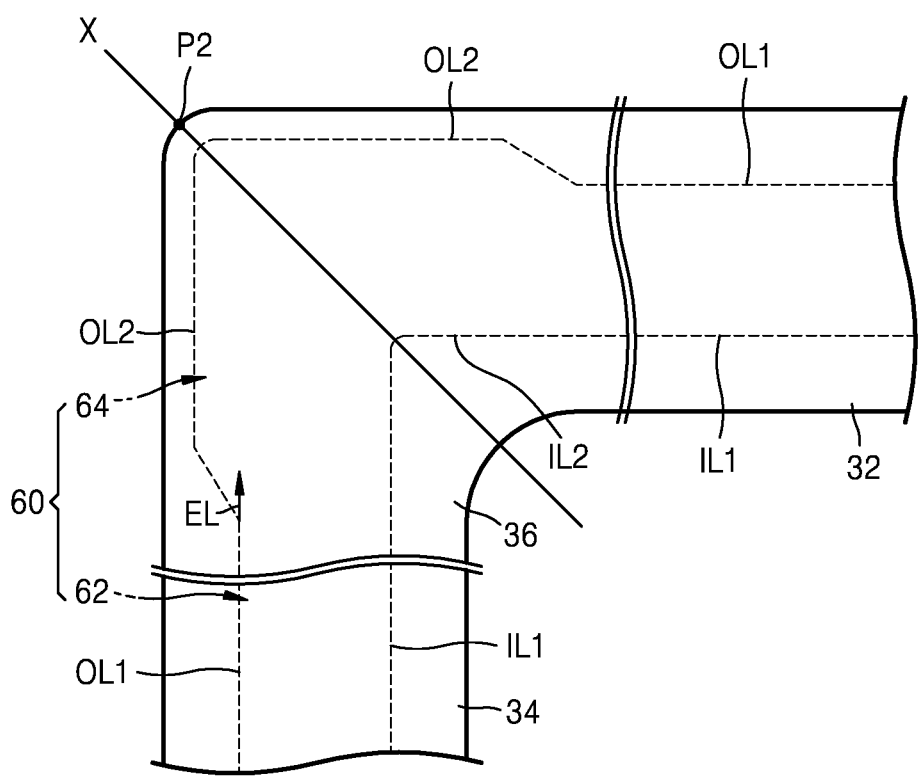
FIG. 8 is a plan view illustrating a seal auxiliary portion according to another embodiment.

FIG. 8 is a plan view illustrating a sealing auxiliary portion according to another embodiment. When FIGS. 5 and 8 are compared to each other, the seal auxiliary portion 60 of FIG. 8 may omit a hole(s). That is, the seal auxiliary portion 60 may be arranged between the first substrate 10 and the seal member 30, and may include a metal having a non-uniform width. The non-corner portion of FIG. 6 may omit holes.

As explained above, according to the present embodiment, an improved bonding performance is provided to a corner portion of a display apparatus. However, the present disclosure is not limited thereto.

It should be understood that exemplary embodiments described herein should be considered in a descriptive sense only, and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a first substrate;
a display element on the first substrate;
a second substrate facing the first substrate;
a sealing member between the first substrate and the second substrate, the sealing member being around the display element;
a metallic layer between the first substrate and the sealing member, the metallic layer comprising:
a metallic non-corner portion overlapped by the sealing member; and
a metallic corner portion overlapped by the sealing member and being integrally formed with the metallic non-corner portion, the metallic corner portion having a first width in a first direction, the first width being greater than a second width of the metallic non-corner portion in the first direction,
wherein a first distance between an outer edge of the sealing member and an outer edge of the metallic corner portion is less than a second distance between the outer edge of the sealing member and an outer edge of the metallic non-corner portion.

2. The display apparatus of claim 1, wherein the sealing member has a third width in the first direction, the third width being greater than the first width or the second width.

3. The display apparatus of claim 2, wherein the third width is equal to or greater than about 700 μm.

4. The display apparatus of claim 1, wherein a first interval between the outer edge of the metallic non-corner portion of the metallic layer and an edge of the first substrate is greater than a second interval between the outer edge of the metallic corner portion of the metallic layer and the edge of the first substrate.

5. The display apparatus of claim 1, further comprising a transistor electrically connected to the display element and comprising an active layer, a gate electrode, a source electrode and a drain electrode, wherein the metal layer comprises a same material as the gate electrode, the source electrode, or the drain electrode of the transistor.

6. The display apparatus of claim 1, wherein the first substrate comprises a first inner surface, a first outer surface opposite to the first inner surface, and a first side surface connecting the first inner surface to the first outer surface,
wherein the second substrate comprises a second inner surface facing the first inner surface, a second outer surface opposite to the second inner surface, and a second side surface connecting the second inner surface to the second outer surface, and
wherein the first side surface, the second side surface, and an outer side surface of the sealing member form a substantially continuous surface.

7. The display apparatus of claim 1, wherein the metallic layer has a plurality of holes separated from one other.

8. A display apparatus comprising:
a first substrate;
a display element on the first substrate;
a second substrate facing the first substrate;
a sealing member between the first substrate and the second substrate, the sealing member being around the display element;
a metallic layer between the first substrate and the sealing member and overlapped by the sealing member, wherein the metallic layer comprises:
a metallic corner portion overlapped by the sealing member and having a first inner edge and a first outer edge, wherein a first width is defined between the first inner edge and the first outer edge; and
a metallic non-corner portion overlapped by the sealing member and having a second inner edge and a second outer edge, wherein a second width is defined between the second inner edge and the second outer edge and is less than the first width,
wherein a first distance between an outer edge of the sealing member and an outer edge of the metallic corner portion is less than a second distance between the outer edge of the sealing member and an outer edge of the metallic non-corner portion.

9. The display apparatus of claim 8, wherein the sealing member has a third width that is defined between the outer edge of the sealing member and an inner edge of the sealing member, wherein the third width is greater than the first width or the second width.

10. The display apparatus of claim 8, wherein an interval between the second outer edge and an edge of the first substrate is greater than an interval between the first outer edge and the edge of the first substrate.

11. The display apparatus of claim 8, wherein the first substrate comprises a first inner surface, a first outer surface opposite to the first inner surface, and a first side surface connecting the first inner surface to the first outer surface,
wherein the second substrate comprises a second inner surface facing the first inner surface, a second outer surface opposite to the second inner surface, and a second side surface connecting the second inner surface to the second outer surface, and
wherein the first side surface, the second side surface, and an outer side surface of the sealing member form a substantially continuous surface.

12. The display apparatus of claim 8, wherein the metallic corner portion is integrally formed with the metallic non-corner portion.

13. The display apparatus of claim 8, wherein the metallic corner portion comprises a same material as the metallic non-corner portion.

14. The display apparatus of claim 8, wherein the metallic corner portion comprises a first sub-corner portion that has the first inner edge and a second sub-corner portion that has the first outer edge, and
wherein the first sub-corner portion and the second sub-corner portion are separated from each other.

15. The display apparatus of claim 14, wherein the first sub-corner portion is integrally formed with the metallic non-corner portion.

16. The display apparatus of claim 14, further comprising an insulating layer between the first sub-corner portion and the second sub-corner portion.

17. The display apparatus of claim 14, wherein the first sub-corner portion and the second sub-corner portion are positioned on a same insulating layer.

18. The display apparatus of claim 14, wherein each of the first sub-corner portion and the metallic non-corner portion has a plurality of holes.

19. The display apparatus of claim 8, wherein the metallic corner portion comprises a first sub-corner portion that has the first inner edge, and a second sub-corner portion that has the first outer edge, the first sub-corner portion being at a different layer than the second sub-corner portion.

\* \* \* \* \*